United States Patent
Chen et al.

(10) Patent No.: US 12,126,335 B2
(45) Date of Patent: Oct. 22, 2024

(54) DAC-BASED TRANSMIT DRIVER ARCHITECTURE WITH IMPROVED BANDWIDTH

(71) Applicant: XILINX, INC., San Jose, CA (US)

(72) Inventors: Li-Yang Chen, San Jose, CA (US); Chi Fung Poon, Sunnyvale, CA (US); Chuen-Huei Chou, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/115,588

(22) Filed: Feb. 28, 2023

(65) Prior Publication Data

US 2024/0291487 A1  Aug. 29, 2024

(51) Int. Cl.
| | |
|---|---|
| *H04B 1/04* | (2006.01) |
| *H03K 17/00* | (2006.01) |
| *H03K 17/693* | (2006.01) |
| *H04B 1/40* | (2015.01) |

(52) U.S. Cl.
CPC ......... *H03K 17/693* (2013.01); *H03K 17/005* (2013.01); *H04B 1/0483* (2013.01); *H04B 1/40* (2013.01)

(58) Field of Classification Search
CPC .... H03K 17/002; H03K 17/005; H03K 17/04; H03K 17/041; H03K 17/04106; H03K 17/687; H03K 17/6871; H03K 17/6872; H03K 17/6874; H03K 17/693; H04B 1/02; H04B 1/04; H04B 1/0483; H04B 1/40; H04B 1/44
See application file for complete search history.

(56) References Cited

U.S. PATENT DOCUMENTS

| | | | | |
|---|---|---|---|---|
| 6,385,214 B1 * | 5/2002 | Kikuchi | ............... | H03K 17/162 |
| | | | | 327/407 |
| 11,824,534 B2 * | 11/2023 | Narang | ............... | H04L 25/0272 |

OTHER PUBLICATIONS

Choi, M., et al., "An Output-Bandwidth-Optimized 200Gb/s PAM-4 100Gb/s NRZ Transmitter with 5-Tap FFE in 28nm CMOS," 2021 IEEE International Solid-State Circuits Conference (ISSCC), San Francisco, CA, USA, 2021, pp. 128-130.
U.S. Appl. No. 16/654,460, filed Oct. 16, 2019 Entitled "Machine Learning Based Methodology for Signal Waveform, Eye Diagram and Bit Error Rate (BER) Bathtub Prediction".

* cited by examiner

*Primary Examiner* — Long Nguyen
(74) *Attorney, Agent, or Firm* — Patterson + Sheridan, LLP

(57) ABSTRACT

A transmission system is disclosed including a driver circuit. The driver circuit includes multiplexer circuits that receive parallel data and operate as a differential pair. At least one of the multiplexer circuits is coupled to a first circuit node and a second circuit node of the driver circuit. The at least one the multiplexer circuits outputs serial data from the multiplexer circuits at the first and second circuit nodes. The first and second nodes are coupled to a differential output network. The first and second nodes are coupled to an inductor circuit. The first and second nodes are coupled to a cross-coupled circuit. The inductor circuit drains driver circuit current at the first circuit node. The second circuit node and the cross-coupled circuit steer driver circuit current at the first circuit node and the second circuit node.

20 Claims, 8 Drawing Sheets

DAC-BASED TRANSMIT DRIVER ARCHITECTURE WITH IMPROVED BANDWIDTH

TECHNICAL FIELD

Examples of the present disclosure generally relate to circuitry that is used to implement high-speed serial data transmission systems. The disclosure has specific application to high speed transmitters, and particularly as implemented, in an enhanced tail-less current-mode logic (CML) driver. One such circuit in which the disclosure can be implemented for this purpose is within a field-programmable gate array (FPGA).

BACKGROUND

The use of high-speed serial communication links in electronic systems has continued to grow. In certain cases, serial links may be used for integrated circuit (IC) communications within an electrical device (e.g., a serial bus between memory and a processing system) and/or between electrical devices (e.g., serial bus between a computer and a wearable device). In other cases, serial links may be used for inter-circuit communications within a system-on-a-chip (SoC). High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A serializer/deserializer (SerDes) may be used to transmit and receive data via a serial communication link. A SerDes transmitter serializes a multi-bit word into a 1-bit wide serial data stream of corresponding bits. A SerDes receiver deserializes the received serial data stream into the original multi-bit word. In some SerDes systems, a clock signal is transmitted along with the serial data stream, whereas in other SerDes systems, the clock signal is instead embedded in the serial data stream.

As the speed of these systems has increased, various improvements are desirable regarding the electro-mechanics of the serial transmissions so as to further increase the serial transmission speeds within the system. In particular, circuit improvements are provided in the present disclosure that improve the current steering ratio to bandwidth tradeoff within 200+Gb/s PAM4 or 100+Gb/s NRZ serial transmission systems, among others.

SUMMARY

In one example, a transmission system is provided including a driver circuit. The driver circuit includes multiplexer circuits that receive parallel data and operate as a differential pair. At least one of the multiplexer circuits is coupled to a first circuit node and a second circuit node of the driver circuit. The at least one multiplexer circuit outputs serial data from the multiplexer circuits at the first and second circuit nodes respectively. The first and second circuit nodes are coupled to a differential output network. The first and second circuit nodes are coupled to an inductor circuit. The first and second circuit nodes are coupled to a cross-coupled circuit. The inductor circuit drains driver circuit current at the first circuit node and the second circuit node. The cross-coupled circuit steer driver circuit current at the first circuit node and the second circuit node.

In one example, a method for operating a driver circuit within a transmission system includes receiving parallel data at multiplexer circuits. The multiplexer circuits operate as a differential pair. At least one of the multiplexer circuits is coupled to a first circuit node and a second circuit node of the driver circuit. Further, the method includes draining driver circuit current with an inductor circuit. The inductor circuit is coupled to the first and second circuit nodes. The method further includes steering driver circuit current with a cross-coupled circuit. The cross-coupled circuit coupled to the first and second circuit nodes.

In one example, a transmission system includes a driver circuit. The driver circuit includes a first multiplexer circuit and a second multiplexer circuit. The first and second multiplexer circuits operate as a differential pair. The first and second multiplexer circuits are coupled to a first parallel data bus and a second parallel data bus, and receive parallel input data on the first parallel data bus and the second parallel data busses. The first and second multiplexer circuits are coupled to a first node and a second node of the driver and output serial data from the first and second multiplexers at the first and second nodes. The first and second nodes are coupled to an inductor circuit. The first node couples the first multiplexer circuit to a first cascode device and to a cross-coupled circuit. The second node couples the second multiplexer circuit to a second cascode device and to the cross-coupled network. The cross-coupled network drains current from the inductor circuit. The first cascode device is coupled to a first output node and outputs serial data from the first node at the first output node. The second cascode device is coupled to a second output node and outputs serial data from the second node at the second output node.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

Figure 1:
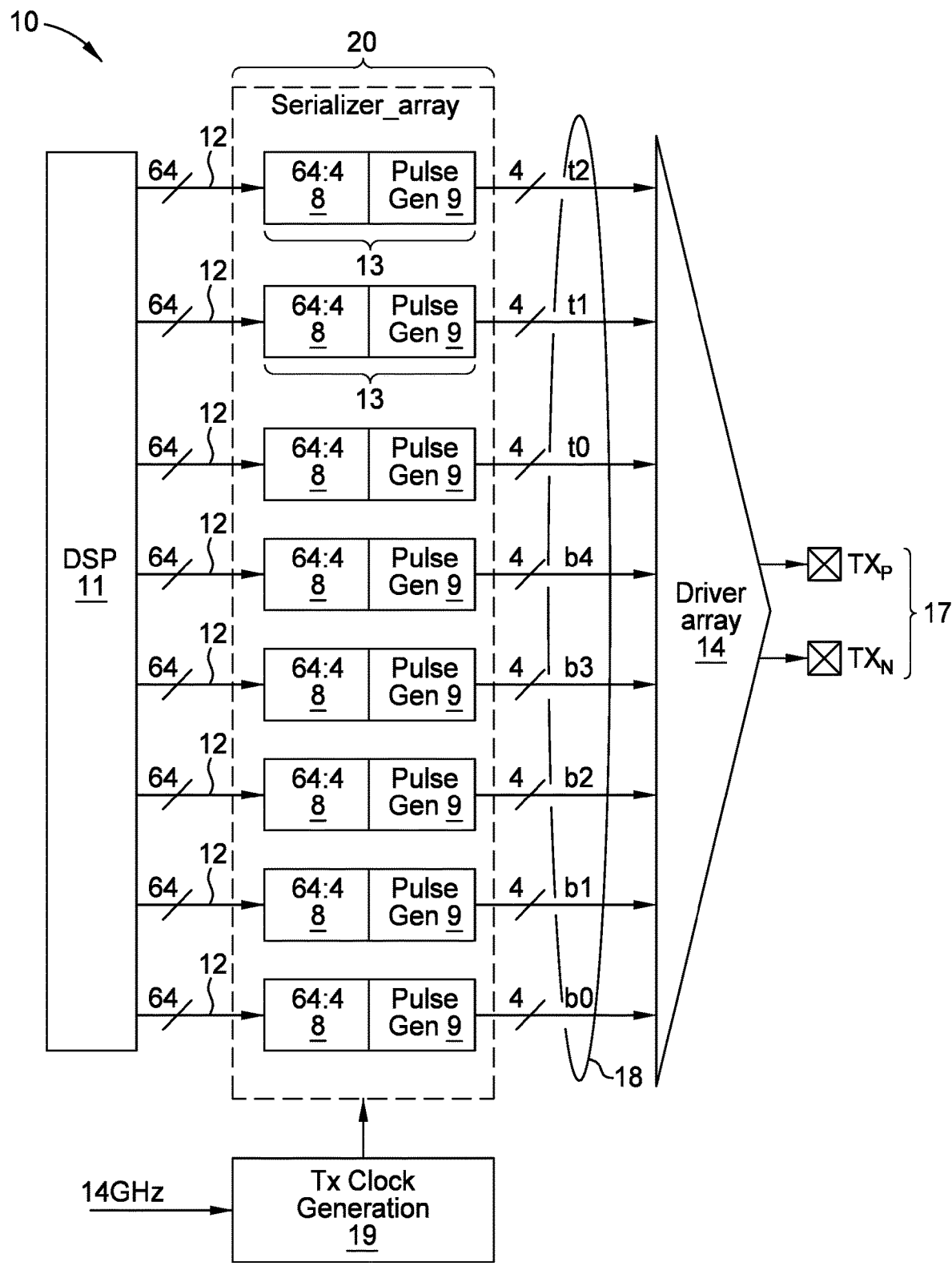
FIG. 1 shows block diagram of an example transmitter circuit architecture employing the system, apparatus and methods of the present disclosure according to certain aspects of the present disclosure.

To facilitate understanding, identical reference numerals, or superscripted/subscripted versions of the same, have been used, where possible, to designate identical and/or similar elements that are common to the figures. It is contemplated that elements of one example may be beneficially incorporated into other examples without specific recitation.

DETAILED DESCRIPTION

Examples of the present disclosure generally relate to a digital-to-analog converter (DAC) based transmit driver architecture with improved bandwidth, such as for use within a serializer/deserializer (SerDes) transmitter system. The transmit driver architecture may have multiple DAC slices, in which a single bias transistor in each DAC slice is coupled between an output of a final multiplexing stage of the DAC slice and the output of the transmit driver (the output PAD). In some examples, the transmit driver architecture may further include certain circuitry, such as active inductor networks and cross-coupled transistor networks within each DAC slice and coupled to the output of the final multiplexing stage in each DAC slice. The additional circuitry may be included to further improve the bandwidth and refine the step responses of the output of the transmit driver.

In one or more examples, a DAC slice of a transmit driver includes one or more output multiplexers within the final multiplexing stage. However, even though the impedance of the corresponding output node is low, the output multiplexer (or multiplexers) increase the corresponding circuit capacitance, which decreases the bandwidth of the corresponding driver circuit. In one or more examples, the overdrive voltages of a DAC slice are increased to mitigate the reduction in bandwidth caused by the increased capacitance associated with the output multiplexer. However, increasing the overdrive voltages negatively affects termination impedance of the DAC slice as the overdriven devices operate in a linear region to increase the operating bandwidth. In some examples, an active inductor circuit block is used to function as a current drain to extract residual current from DAC slice, allowing for faster switching by the output multiplexers. However, the active inductor circuit block degrades the current steering ratio of the devices within the DAC slice, degrading the signal swing of the corresponding transmission system.

In one or examples, as will be described in more detail in the following, a cross-coupled pair of transmitters is introduced within a DAC slice to aid in steering the residual current driven by the inductor circuit block, improving the operating speed and signal swing performance of the corresponding transmission system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example Serialization Circuit

By way of background, the digital feedforward equalizer (FFE) of the present disclosure is used to equalize a serialized transmission channel and recover the digital date input thereto. In order to recover the digital data with a high fidelity, however, a power-hungry analog-to-digital (ADC) conversion process is used to digitize the signal. This disclosure addresses some of the optimization techniques used within that power consuming portion of the data conversion circuitry.

FIG. 1 is a block diagram of an example serializing transmitter circuit 10, in which aspects of the present disclosure may be practiced. As shown, the data input to transmitter circuit 10 may include parallel data source 11 in the form of a digital signal processor (DSP). In the example of FIG. 1, parallel data source 11 outputs its parallel data on a number of 64-bit parallel data busses 12 which are then input to serializer array 20. Within serializer array 20 are a set of data processing blocks 13, one-each servicing a full set of 64-bit parallel data on parallel data busses 12. Each data processing block 13 is coupled to parallel data busses 12 and includes a 64:4 bit multiplexer 8 and a pulse generator 9. Various other components (not relevant to the present disclosure) are also included within the serializer array to achieve a 5-tap FFE output from serializer array 20.

In general, the data path from parallel data source 11 to driver array 14 is composed of: pattern/data generators, 64:4 serializers, a thermometer encoder, and retimers, followed by equally-weighted FFE driver bundles which are part of driver array 14. The driver bundles receive either the three thermometer-encoded signals (t2:10) in PAM-4 mode or three identical signals for NRZ mode. The retimer outputs (b5:b0) and the thermal encoded signals (12:10) are output from serializer array 20 on 4-bit wide busses 18 and fed to driver array 14. Serializer array 20 and associated pulse generators receive timing information from external clock generator 19, which provides for all proper clocking and skew correction so as to maximize and control all timing margins and correct for worst-case output eye width to and from driver array 14. Ultimately, differential transmission of the fully-serialized high-speed serial data stream is output on differential output signal pair 17 as TXp and TXn.

Figure 2:
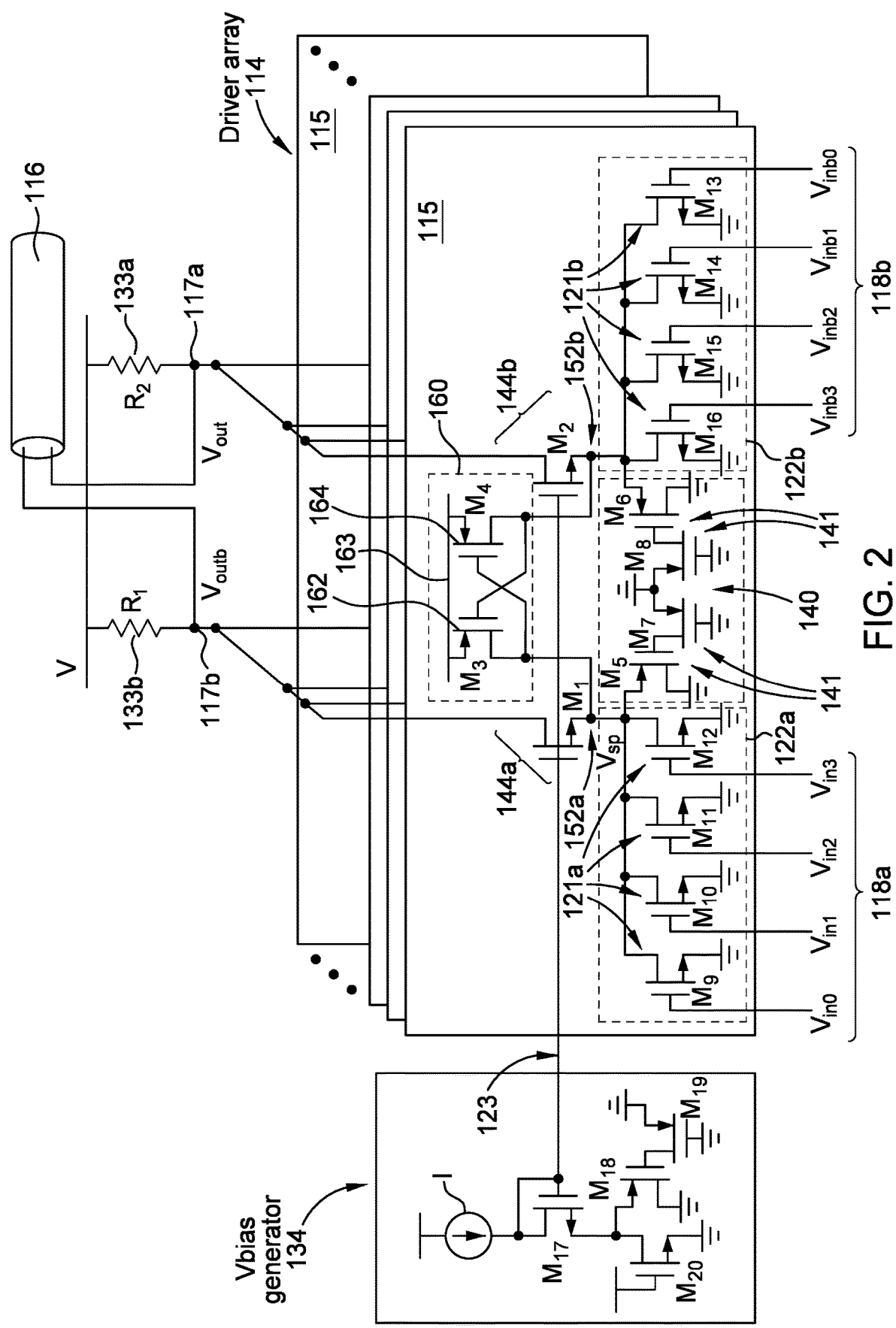
FIG. 2 shows a driver array subsystem employing the system apparatus and methods of the present disclosure according to certain aspects of the present disclosure.

FIG. 2 shows the enhanced tail-less CML driver and a circuit diagram of a portion of an exemplary transmitter in which aspects of the present disclosure may be practiced. Included within FIG. 2 are voltage bias generator circuit 134 and driver array 114 consisting of a plurality of driver array slices 115. Pull-up termination resistors 133b and 133-indicated as R1 and R2 respectively—are coupled to the output nodes of driver array slice(s) 115. Voltage bias generator circuit 134 includes a network of transistors (M17:M20) and a current source (1) that provides a bias voltage at bias voltage circuit node 123. Pull-up resistor R1 is coupled to driver array slice(s) 115 at driver array output node 117b and pull-up resistor R2 is coupled to driver array slice(s) 115 at complementary driver array output nodes 117a. Voutb and Vout at driver array output node 117b and driver array output node 117 respectively, are differential, high-speed serial output voltages generated by driver array slice(s) 115 and transmitted over differential signal transmission line 116.

Within each driver slice are a network of circuits that serialize parallel input data provided over a four-bit parallel data bus and output the serialized, 1-bit wide, high-speed data on data output signal line coupled at driver array output nodes 117/117b. Specifically, the driver array 114 includes a plurality of the driver array slice(s) 115. As inputs thereto, differential, 4-bit wide parallel data is provided on parallel input bus 118 (Vin3:Vin0) and complementary parallel input bus 118b (Vinb3:Vinb0). The 4-bit wide parallel data busses are input to multiplexer switch blocks 122 and 122b. Each multiplexer switch block 122/122b includes four enhancement mode, n-type MOSFET transistors 121/121b or (M9: M12)/(M13:M16) respectively. Multiplexer switch blocks 122/122b accept the parallel data (Vin3:Vin0/Vinb3:Vinb0) from the parallel input bus, one data line input per transistor, coupled to the MOSFET gates of those transistors. The drain terminals of MOSFET transistors 121 are all coupled and connected together at a driver circuit first internal node 152. The source terminals of MOSFET transistors 121b are all coupled and connected at a driver circuit second internal node 154. The drain terminals of all transistor switches M9:M13 are connected to ground.

Inductor circuit block 140 is included within each driver array slice(s) 115 and consists of a set of enhancement, p-type MOSFET transistors 141. Inductor circuit block 140 has two external circuit connections within the driver circuit, one each coupled to first internal node 152 and second internal node 152b respectively. The arrangement and contents of the circuitry within inductor circuit block 140 may vary, but in any case inductor circuit block 140 should be designed to act as an active inductor. In the example of FIG. 2, inductor circuit block 140 consists of four transistors (M5:M8) with all gates and sources essentially connected to ground except for the two external connections at first internal node 152 and second internal node 154.

Two cascode devices, first cascode device 144 and second cascode device 144b are also included with each driver array slice(s) 115. First cascode device 144 and second cascode device 144b are shown in FIG. 2 as M1 and M2 respectively. As shown by example, each cascode consists of a single enhancement mode, n-type MOSFET transistor. The gates of each cascode are coupled and electrically connected to bias voltage circuit node 123. First cascode device 144 is connected at its source to first internal node 152 and at its drain to driver array output node 117b. Second cascode device 144b is connected at its source to second internal node 152b and at its drain to driver array output node 117.

To complete the circuit of FIG. 2, each driver array slice 115 includes cross-coupled circuit 160. In the example of FIG. 2, 160 comprises two cross-coupled, enhancement mode, p-type MOSFET transistors: first cross-coupled transistor 162 and second cross-coupled transistor 164. Both cross-coupled transistors have their sources coupled to and electrically connected with source voltage rail 163. The drain of first cross-coupled transistor 162 is coupled to and electrically connected with node 152a and the gate of second cross-coupled transistor 164. The drain of second cross-coupled transistor 164 is coupled to and electrically connected with both node 152b and the gate of first cross-coupled transistor 162.

In operation, driver array slice(s) 115 perform as follows. Input parallel data is clocked into each driver array slice(s) 115, one bit at a time in sequence: Bin0/Binb0; Bin1/Binb1; Bin2/Binb2 and Bin3/Binb3. To clock in a single data bit, complementary bias voltages are provided at the single data lines within each of complementary data parallel inputs at the respective line on the parallel data interface. For example, if the least significant data bit Bin0/Binb0 being input is a logical 0 the following sequence of voltage levels will be present in driver array slice(s) 115. A low voltage signal is present on data line Vin0 representing Bin0, and complementary high-voltage signal is present on data line Vinb0 representing Binb0. In this data presentation, a threshold gate voltage is not present at the gate of MOSFET M9, and M9 will not be bias the drain of M1 in relation to the first cascode gate bias voltage at bias voltage circuit node 123. First cascode device 144 will not turn on and complementary driver circuit output node will "float" in that pull up resistor R1 will cause the voltage at 177b to rise to a "high" (logic 1) signal value at Voutb. Alternatively, on the complementary circuit side of driver array slice 115, a high voltage signal is present on data line Vinb0, and complementary high-voltage signal is present on data line Vinb0 representing Binb0 equal to logical "1" Therefore, a threshold gate voltage is present at the gate of MOSFET M13, and M13 is bias in that the threshold voltage is achieved at the drain of second cascode device 144b in relation to the second cascode device 144b gate bias voltage at bias voltage circuit node 123. Second cross-coupled transistor 164 turns on and complementary driver circuit output node is driven low in that current will flow through pull up resistor R2 which will cause the voltage at driver array output node 117 to drop, thereby presenting a low voltage at Vout. In this manner, bit-by-bit as presented on parallel input buses 118 and 118b, the individual active transistors 121 and 121b within parallel input buses 118 and 118b, along with and the associated MOSFETs operation of M1 and M2 function as a differential pair in presenting complementary signals to the driver array output node 117/117b.

Tunable Voltage Bias

It should be appreciated that first internal node 152 and second internal node 152b play a pivotal role in the transmitter circuit operation. As each complementary bit pair is presented on the parallel data busses, the two internal circuit nodes work in differential fashion, attaining high/low and low/high voltages alternatively so as to present complementary signal outputs at driver array output node 117b and driver array output node 117 respectively. The faster that the two internal nodes can achieve a stable signal value, the faster transmitter circuit 10 can operate. In this regard, three components of driver array slice(s) 115 operate to fine tune the driver circuit operation: voltage bias generator circuit 134, inductor circuit block 140 and cross-coupled circuit 160.

Regarding the first tuning component, the output of the voltage bias generator circuit 134 is presented at bias voltage circuit node 123. The output voltage of the bias generator may be programmably regulated through the selection of component transistors M17:M19 and various other components within voltage bias generator circuit 134. Output bias voltage from voltage bias generator circuit 134 is presented at the gates of the cascodes 144/144b so as to bias those cascodes as part of the complementary paring of those transistors with the active transistors within multiplexer switch blocks 122 and 122b respectively. To achieve optimal signal response, the bias voltage may be adjusted in response to the desired signal swing at the overall differential output at driver array output node 117b and driver array output node 117.

Inductor Operation

During the transmitter circuit operation, M9-M16 and M1-M2 typically conduct a high current density in order to drive the low-valued 500 load impedance (R1, R2). Even though the output node is low impedance, the 4:1 output multiplexing in transistors 121/121b increase driver circuit capacitance which leads to driver circuit bandwidth degradation. To address the bandwidth degradation caused by output multiplexing, the driver capacitance can be reduced by increasing the overdrive voltages of the cascode devices through the selection and programming of the circuit components in voltage bias generator circuit 134. However, this approach sacrifices the quality of the termination impedance since the overdriven cascode devices would be forced to operate in their linear regions to achieve the desired bandwidth. As an alternative solution, inductor circuit block 140 may be introduced between first internal node 152 and second internal node 152b. In FIG. 2, inductor circuit block 140 comprises a symmetrical arrangement p-type MOSFET transistors (M5:M8) configured to perform as an active indictor. In the configuration shown in FIG. 2, inductor circuit block 140 essentially acts as a current drain that extracts residual current from the cascode devices thereby permitting faster switching at first internal node 152 and second internal node 154. However, a secondary effect occurs when the contingent current of the active inductors is introduced at first internal node 152 and second internal node 152b. In one or more examples, inductor circuit block 140 degrades the current steering ratio of the cascode devices and hence the signal swing of the overall transmission system.

Cross-Couple Circuit Operation

To address the above-indicated current steering problem, a small cross-coupled pair of PMOS transistors (M3, M4) is introduced and coupled at first internal node 152 and second internal node 152b. Cross-coupled circuit 160 helps first cascode device 144 and second cascode device second cascode device 144b steer the residual current driven by inductor circuit block 140 and hence improve the speed-swing tradeoff. By way of example, assuming 152 is high and 152b is low, M3 will turn on and pull 152 higher therefore helping M1 to turn off and reduce the current leakage through M3.

Figure 3:
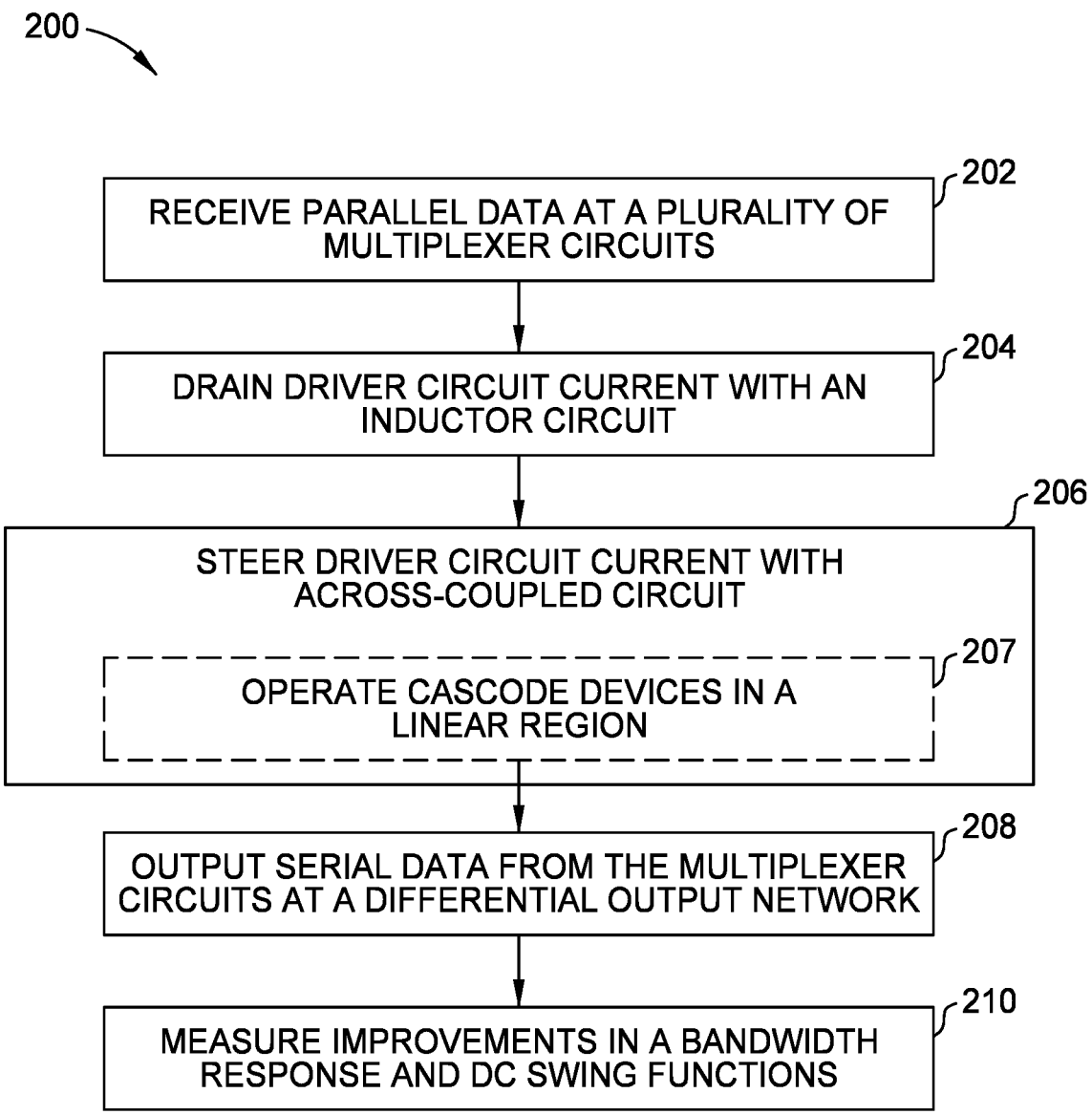
FIG. 3 is a flow diagram of example operations for driving data according to certain aspects of the present disclosure.

Referring to FIG. 3, a method 200 of operating the above-recited driver circuit is provided. At 202 of the method 200, the parallel data is received at the plurality of multiplexer circuits within the driver circuit. At 204 of the method 200 the driver circuit current used to generate outputs from the multiplexer circuits at first internal node 152 and second internal node 152b, which is then drained by inductor circuit block 140. At 206 of the method 200, the driver circuit current used to generate outputs from the multiplexer circuits at first internal node 152 and second internal node 152b is steered using cross-coupled circuit 160. As part of the steering function, 207 of the method 200 is executed so that first cross-coupled transistor 162 and second cross-coupled transistor 164 operate well within their non-linear regions. After steering, 208 of the method 200 is executed such that the drained and steered multiplexer outputs at first internal node 152 and second internal node 152b are presented at driver array output nodes 117 and 177b. Finally, at 210 of the method 200 improvements in the driver circuit's bandwidth response function and DC swing functions are measured as a gauge of the overall performance of transmitter circuit 10.

Advantages over Existing Circuitry

Figure 4A:
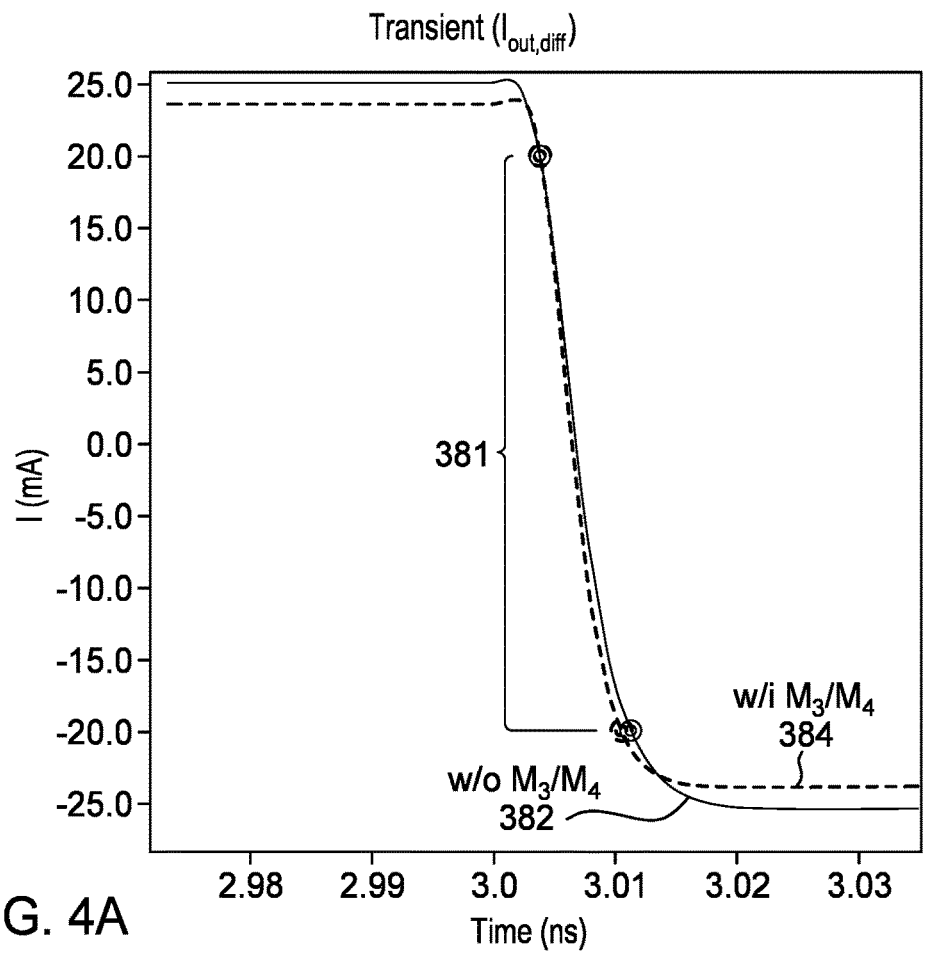
FIG. 4A shows a graph of the simulated step response of the subsystem of FIG. 2 according to certain aspects of the present disclosure.
Figure 4B:
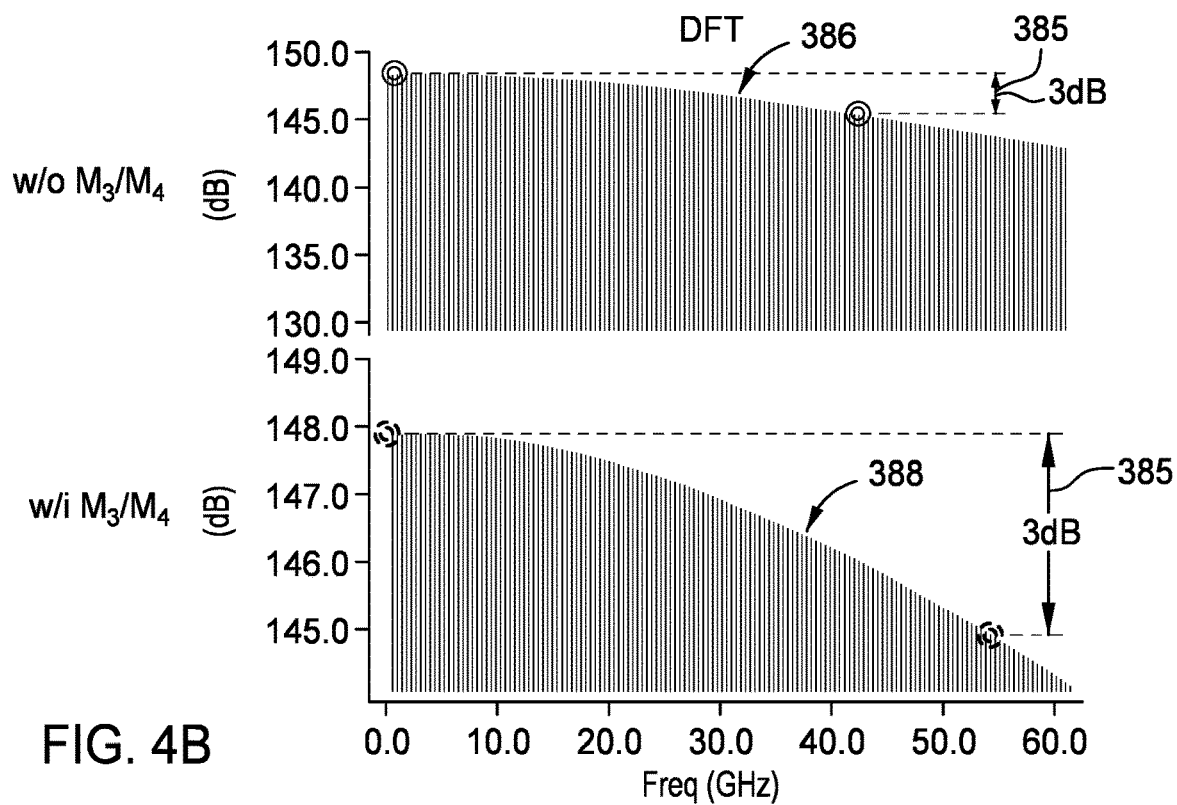
FIG. 4B shows a graph of the frequency transformation of the simulated step response of the circuit of FIG. 2 according to certain aspects of the present disclosure.

FIGS. 4A and 4B show two graphical outputs of the computer-simulated response functions of the circuit operating according the above-recited aspects the present disclosure. With respect to FIG. 4A, the high-to-low current step response of the non-return-to-zero signal is shown as operating within the system driver circuitry under two different conditions. The current step response provides a first-order response function of the driver circuit when the input current is changed as a result of input signal change and is one measure of signal transmission speed. The fall time of the step response is the time it takes the current to transition from 80% of its maximum value to 20% of the corresponding minimum value. In both cases depicted in FIG. 4A, the 40 mA current transition 381 from a high signal value of 20 mA to a low of −20 mA is shown and the corresponding fall times are measured.

The current step response without cross-coupled circuit 160 is shown at 382. Without cross-coupled circuit 160, the fall time of the of the differential output current ($I_{out,diff}$) is shown as the solid line. In this transition, the differential output transitions from approximately 25 mA to −25 mA, has a fall time within the 40 mA window measured (simulated) to be 7.47721 ps. The current step response with cross-coupled circuit 160 is shown at 384. With cross-coupled circuit 160, the fall time of the of the differential output current ($I_{out,diff}$) is shown as the dashed line. In this transition, the differential output transitions from approximately 25 mA to −25 mA, has a fall time within the 40 mA window measured (simulated) to be 6.793161 ps. Using cross-coupled circuit 160, each driver array slice(s) 115 drains current with inductor circuit block 140 during signal transitions while cross-coupled circuit 160 steers the residual current through first cascode device 144 and second cascode device 144b. In this case, the quiescent operating current of driver array slice(s) 115 is held within +/−25 mA which provides for a faster fall time of the current of about 0.684049 ps resulting an approx. 10% reduction in fall time and an improved signal transition speed.

FIG. 4B shows the resulting advantage in the overall system bandwidth using cross-coupled circuit 160. The frequency response of the non-return-to-zero signal is shown as operating within the system circuitry under two different conditions. Specifically, two digital Fourier transform (DFT) plots are estimated (simulated) there: each measuring the frequency and over which a 3 dB loss of signal strength occurs. The 3 dB loss represents a decrease in half the signal strength and is a standard frequency response metric. In both cases depicted in FIG. 4B the 3 dB signal strength drop 385 is shown and the corresponding frequency range over which that signal degradation occurs are measured.

The frequency response without cross-coupled circuit 160 is shown at 386. Without cross-coupled circuit 160, the 3 dB frequency response is shown as the top graph line in the plot. In this response, the signal strength drops from 148.381 dB to 145.38 dB over a bandwidth of approximately 42.3491 GHz. The frequency response with cross-coupled circuit 160 is shown at 388. With cross-coupled circuit 160, the 3 dB frequency response is shown as the bottom graph line in the plot. In this response, the signal strength drops from 147.882 dB to 144.882 dB over a bandwidth of approximately 54.3035 GHz. From a frequency response standpoint, a bandwidth increase of about 11.9544 GHz is achieved using cross-coupled circuit 160 resulting an approx. 28.2% increase in usable bandwidth and concomitant system signal transmission speed.

Figure 5A:
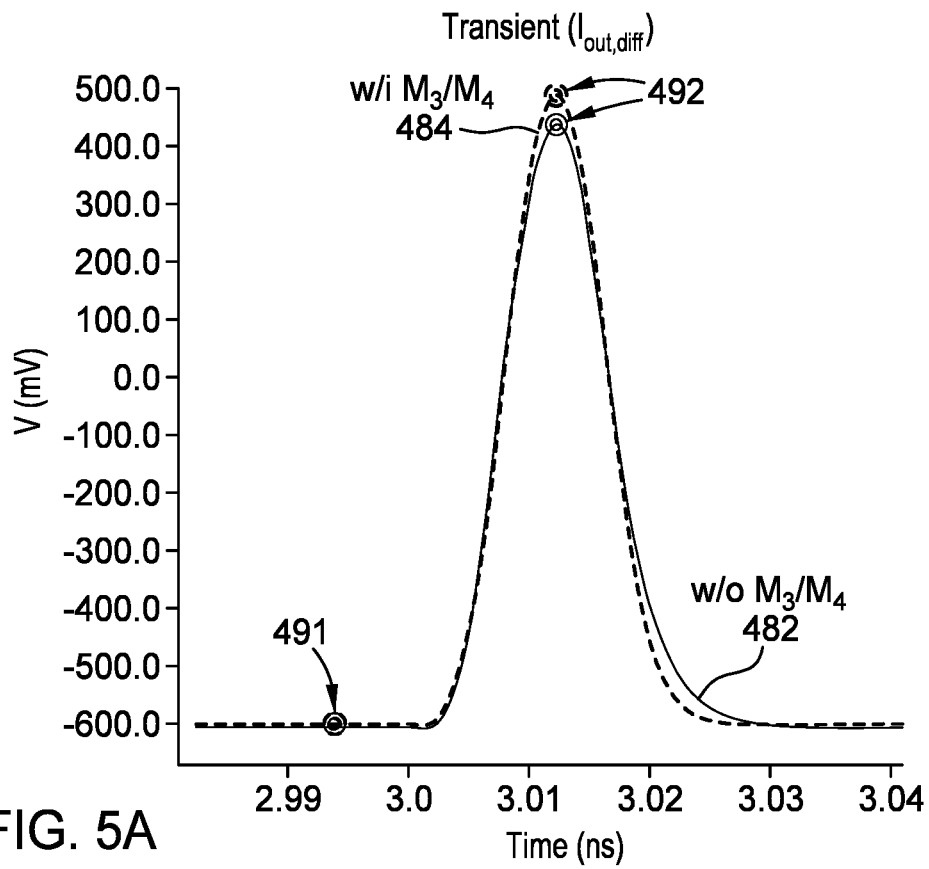
FIG. 5A shows a graph of the transient of a simulated single-bit response of the circuit of FIG. 2 according to certain aspects of the present disclosure.
Figure 5B:
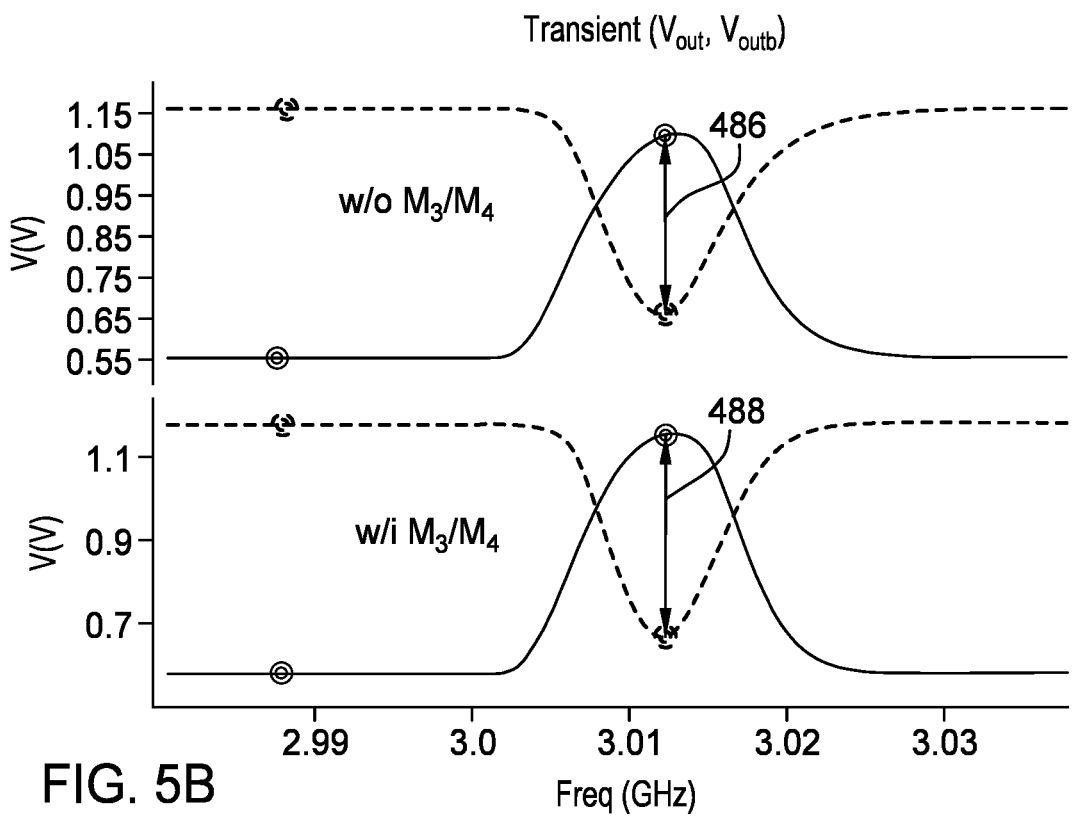
FIG. 5B shows a graph of the data eye of a simulated single-bit response of the circuit of FIG. 2 according to certain aspects of the present disclosure.

FIGS. 5A and 5B show a graphical output of the computer-simulated voltage response functions of the circuit according to the above-recited aspects of present disclosure. With respect to FIG. 5A, the low-to-high peak voltage of a single bit response (SBR) of the NRZ signal is shown as operating within the system circuitry under two different conditions. In both cases, the signal value begins at a base voltage value 491 of −600 mV and transitions to its peak voltage value 492 within driver array slice(s) 115.

The SBR without cross-coupled circuit 160 is shown at 482. Without cross-coupled circuit 160, the output transient voltage peak ($V_{outd}$) is shown as the solid line. In this transition, the peak voltage transitions has a voltage swing of approximately 1.038024V. The SBR with cross-coupled circuit 160 is shown at 484. With cross-coupled circuit 160, the output transient voltage peak ($V_{outd}$) is shown as the dashed line. In this transition, the peak voltage transition has a voltage swing of approximately 1.083366V. Using cross-coupled circuit 160, each driver array slice(s) 115 still maintains a DC swing of >99% and the SBR voltage swing improves by about 4.36%. The DC swing is as Ion/(Ion+Ioff) and is a measure of system performance in that insufficient switching ratio will degrade the DAC driver's linearity.

FIG. 5B shows the resulting eye diagram and improved clarity of the data eye using cross-coupled circuit 160. The eye diagram of the non-return-to-zero signal is shown as operating within the system circuitry under two different conditions. Specifically, two eye diagrams are estimated (simulated) there: each measuring the width of the eye between two respective peak voltages, the two respective peak voltages corresponding to two SBR voltage transitions in each of the high-to-low and low-to-high transitions. The eye diagram provides a measure of the overall signal transitions in response to large numbers of signal transition inputs and patters and provides an indication of the "average" signal transition. The width of the eye is the measurable voltage swing from a logical high-to-low and low-to-high and provides a measure of the signal measuring veracity. In both cases depicted in FIG. 5B, the eye width is shown and the corresponding maximum voltage range over which the quiescent base voltages are conducted.

The eye width without cross-coupled circuit 160 is shown at 486. Without cross-coupled circuit 160, the eye width is simulated to be 432.923 mV over a maximum voltage swing of approximately 605.1 mV. The eye width with cross-coupled circuit 160 is shown at 488. With cross-coupled circuit 160, the eye width is simulated at 483.81 mV over a maximum voltage swing of approximately 599.553. The DC swing is 99% and is calculated as Ion/(Ion+Ioff). The SBR swing is 1.083V which is a 4.3% improvement. Further, 488 is much more symmetric than the response shown in 486, indicating a more reliable signal characteristic for higher-speed transmission signaling.

The table below summarizes the performance improvements achievable in transmission systems employing the teaching of the present disclosure:

| w-w/o 160 | BW | Normalized fan-in | Vppdiff @DC | Vppdiff @SBR | Current switching ratio @DC |
|---|---|---|---|---|---|
| w/o M3/M4 | 42 GHz | 1x | 1.21 V | 1.038 V | 98.73% |
| w/i M3/M4 | 54 GHz | 1x | 1.20 V | 1.083 V | 99.91% |

Example FPGA Arrangements

Figure 6:
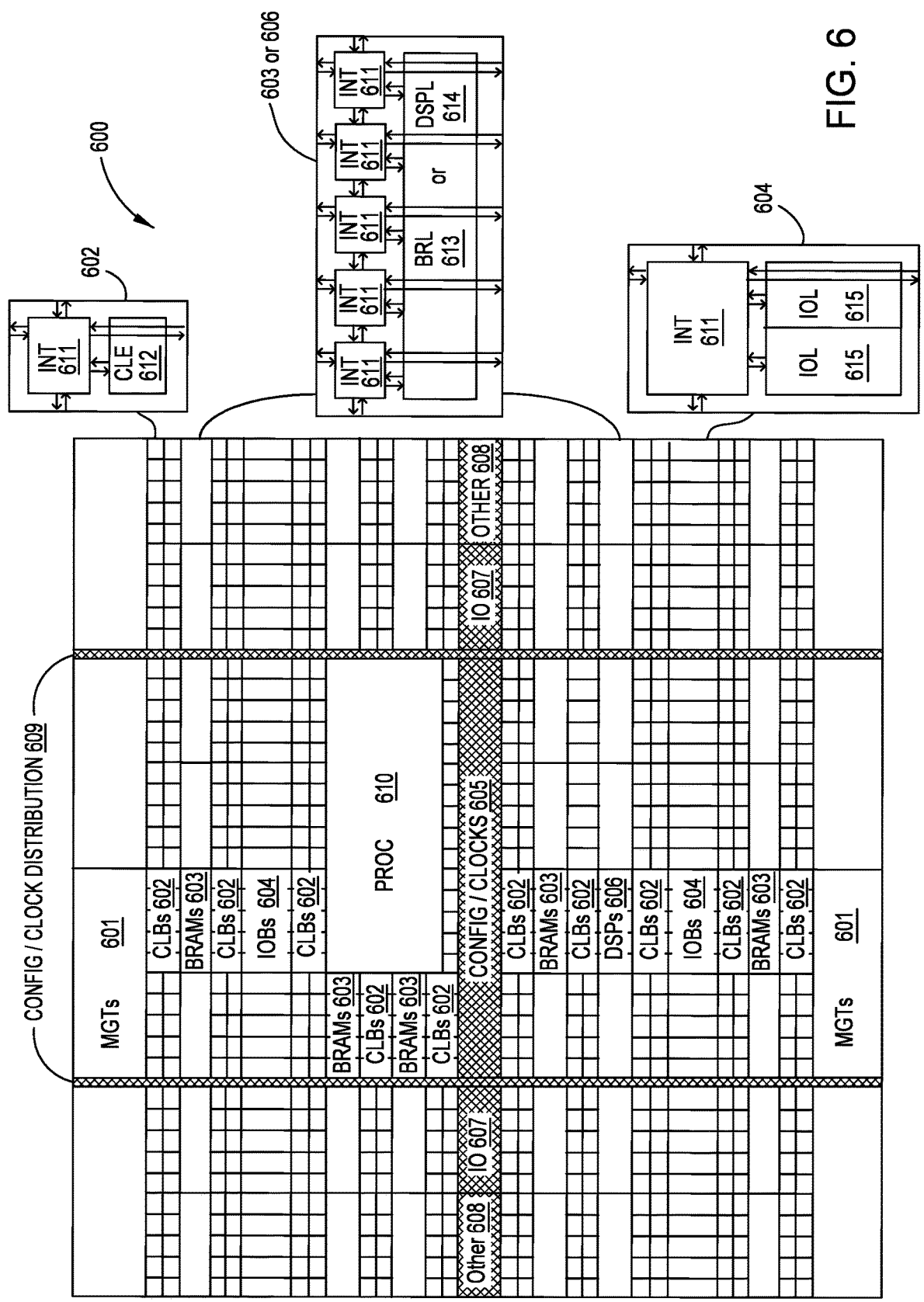
FIG. 6 is a block diagram illustrating an example architecture for a general programmable device, in which aspects of the present disclosure may be practiced.

FIG. 6 is a block diagram illustrating an example architecture 600 for a programmable device. The architecture 600 may be implemented within a field programmable gate array (FPGA), for example. As shown, the architecture 600 includes several different types of programmable circuitry (e.g., logic blocks). For example, the architecture 600 may include a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized I/O blocks 607 (e.g., configuration ports and clock ports), and other programmable logic 608, such as digital clock managers, analog-to-digital converters (ADCs), system monitoring logic, and the like.

In some FPGAs, each programmable tile includes a programmable interconnect element (INT) 611 having standardized connections to and from a corresponding INT 611 in each adjacent tile. Therefore, the INTs 611, taken together, implement the programmable interconnect structure for the illustrated FPGA. Each INT 611 also includes the connections to and from the programmable logic element within the same tile, as shown by the examples included at the far right of FIG. 6.

For example, a CLB 602 may include a configurable logic element (CLE) 612 that can be programmed to implement user logic plus a single INT 611. A BRAM 603 may include a BRAM logic element (BRL) 613 in addition to one or more INTs 611. Typically, the number of INTs 611 included in a tile depends on the width of the tile. In the pictured example, a BRAM tile has the same width as five CLBs, but other numbers (e.g., four) can also be used. A DSP block 606 may include a DSP logic element (DSPL) 614 in addition to an appropriate number of INTs 611. An IOB 604 may include, for example, two instances of an I/O logic element (IOL) 615 in addition to one instance of an INT 611. As will be clear to a person having ordinary skill in the art, the actual I/O pads connected, for example, to the IOL 615 typically are not confined to the area of the IOL 615.

In the example architecture 600 depicted in FIG. 6, a horizontal area near the center of the die (shown shaded in FIG. 6) is used for configuration, clock, and other control logic (CONFIG/CLOCKS 605). Other vertical areas 609 extending from this central area may be used to distribute the clocks and configuration signals across the breadth of the FPGA.

Some FPGAs utilizing the architecture 600 illustrated in FIG. 6 include additional logic blocks that disrupt the regular row structure making up a large part of the FPGA. The additional logic blocks may be programmable blocks and/or dedicated circuitry. For example, a processor block depicted as PROC 610 spans several rows of CLBs 602 and BRAMs 603.

The PROC 610 may be implemented as a hard-wired processor that is fabricated as part of the die that implements the programmable circuitry of the FPGA. The PROC 610 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 610 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 6 that are external to the PROC 610 may be considered part of the, or the, programmable circuitry of the FPGA.

FIG. 6 is intended to illustrate an example architecture 600 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 6 are exemplary. In an actual FPGA, for example, more than one adjacent row of CLBs 602 is typically included wherever the CLBs appear, in an effort to facilitate the efficient implementation of a user circuit design. The number of adjacent CLB rows, however, can vary with the overall size of the FPGA. Further, the size and/or positioning of the PROC 610 within the FPGA is for purposes of illustration only and is not intended as a limitation of the one or more examples of the present disclosure.

Figure 7A:
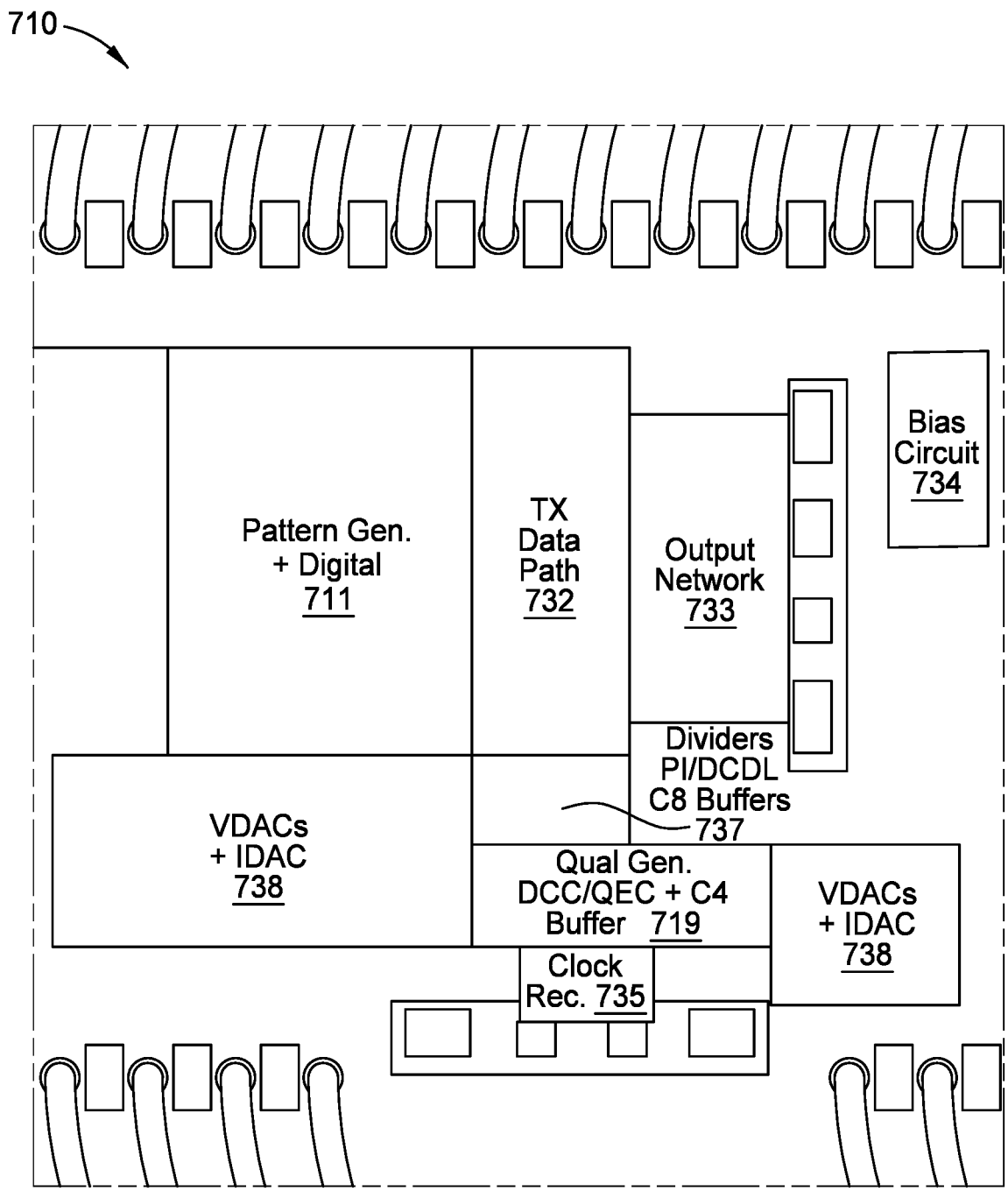
FIG. 7A is a block diagram illustrating an exemplary die micrograph of the programmable device implementing the subsystem of FIG. 2 according to certain aspects of the present disclosure.
Figure 7B:
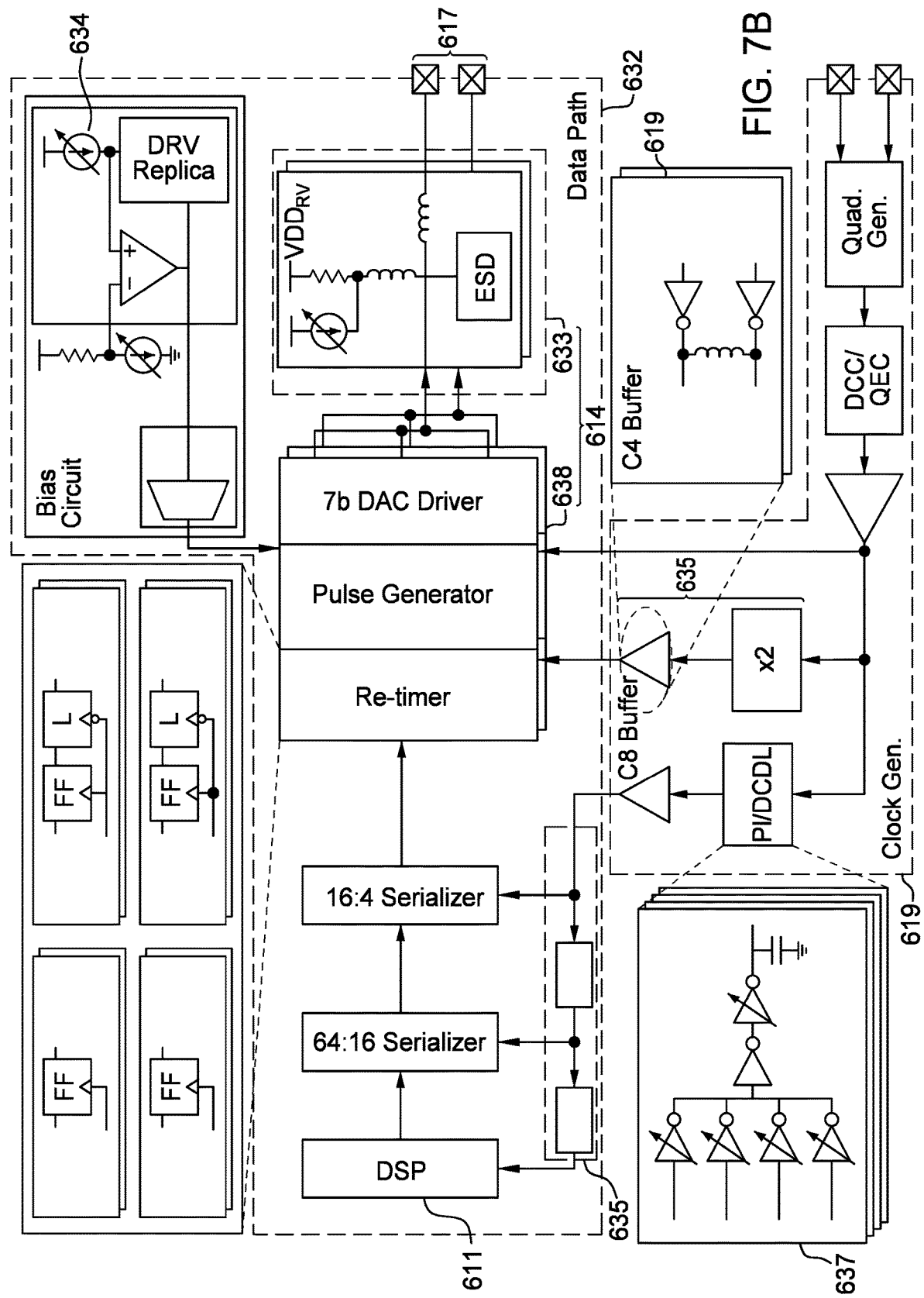
FIG. 7B is a block diagram of the architecture associated with the exemplary die micrograph of FIG. 7A according to certain aspects of the present disclosure.

FIG. 7A is a die micrograph of the FPGA layout of the specific transmission circuit 710 of the disclosure. The transmitter circuit 710 may be constitute one of the IOL 615 of the overall architecture 600. FIG. 7B is an exemplary overall transmission architecture according to the FPGA die layout. Within the transmitter circuit 710 are FPGA areas dedicated to: pattern generation 711, corresponding to pattern generator 611; the transmission data path 732, corresponding to data path circuitry 632; and output network 733, corresponding to output network circuitry 633. Also included is FPGA area dedicated to: bias circuits 734, corresponding to bias circuitry 634; clock receivers 735, corresponding to clock receiver circuitry 635; and various clocking and PLL circuits 719 and 737, both corresponding to the associated circuitry 619 and 637. Finally, FPGA area 738 is configured to house the transmission driver circuits 738, corresponding to the transmission driver block of circuitry 638.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

It is also to be understood that the present disclosure may be implemented in various forms of hardware, software, firmware, special purpose processors, or a combination thereof. In some examples, the present disclosure is implemented in a FPGA designed using a software suite design package to configure specific hardware circuits. The design programs may be uploaded to, and executed by, a machine comprising any suitable architecture. The machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code, configured hardware or part of the program (or combination thereof) which is executed via the operating system of the computer platform. In addition, various other peripheral devices may be connected to the computer platform such as an additional data storage device and a printing device.

It should be appreciated that disclosure is protocol agnostic and hardware independent. Thus, the systems, apparatus and methods disclosed herein can be applied to any transmission protocol. Further, the structure of the disclosed hardware is not limited to a DAC-based transmitter, but it may also be applied to modified analog circuitry. The parallel data digital inputs disclosed herein are not limited to a 4:1 MUX structure. Finally, the disclosed circuitry may be used with any output matching structure and active inductor structures.

It is to be understood that, because some of the constituent system components and method steps depicted in the accompanying figures are preferably implemented in software, the actual connections between the system components (or the process steps) may differ depending upon the manner in which the present disclosure is programmed. Specifically, any of the computers or devices may be interconnected using any existing or later-discovered networking technology and may also all be connected through a lager network system, such as a corporate network, metropolitan network or a global network, such as the internet.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A transmission system comprising:
 a driver circuit, the driver circuit including multiplexer circuits configured to receive parallel data and operate as a differential pair, at least one of the multiplexer circuits coupled to a first circuit node and a second circuit node of the driver circuit and configured to output serial data from the multiplexer circuits at the first circuit node and the second circuit node, the first circuit node and the second circuit node coupled to a differential output network,
 wherein the first circuit node and the second circuit node are coupled to an inductor circuit;
 wherein the first circuit node and the second circuit node are coupled to a cross-coupled circuit; and
 wherein the inductor circuit is configured to drain driver circuit current at the first circuit node and the second circuit node and the cross-coupled circuit is configured to steer the driver circuit current at the first circuit node and the second circuit node.

2. The transmission system of claim 1, wherein the cross-coupled circuit incudes a pair of transistors.

3. The transmission system of claim 1, wherein each of the multiplexer circuits comprises a group of switches.

4. The transmission system of claim 1 further comprising a first cascode transistor and a second cascode transistor, the first cascode transistor coupled between the differential output network and the first circuit node and the second cascode transistor coupled between the differential output network and the second circuit node, the cross-couple circuit configured to steer the driver circuit current to improve an operation of the first cascode transistor and the second cascode transistor.

5. The transmission system of claim 1, wherein the inductor circuit is an active inductor including a plurality of p-type and n type transistors.

6. The transmission system of claim 1, wherein the driver circuit is implemented within a field-programmable gate array.

7. The transmission system of claim 1, wherein the driver circuit is included on one slice of a plurality slices of a driver array, the plurality of slices configured to output the serial data on a common serial transmission line, the common serial transmission line coupled to the differential output network.

8. A method for operating a driver circuit within a transmission system, the method comprising:
receiving parallel data at multiplexer circuits, the multiplexer circuits configured to operate as a differential pair, at least one of the multiplexer circuits coupled to a first circuit node and a second circuit node of the driver circuit;
draining driver circuit current with an inductor circuit, the inductor circuit coupled to the first circuit node and the second circuit node; and
steering the driver circuit current with a cross-coupled circuit, the cross-coupled circuit coupled to the first circuit node and the second circuit node.

9. The method of claim 8 further comprising outputting serial data from the multiplexer circuits at the first and second circuit nodes, the first circuit node and the second circuit node coupled to a differential output network.

10. The method of claim 8, wherein the driver circuit includes a first cascode transistor and a second cascode transistor, the first cascode transistor coupled to the first circuit node and the second cascode transistor coupled to the second circuit node, the steering of the driver circuit current causing the first cascode transistor and the second cascode transistor to operate in a liner region.

11. The method of claim 8, wherein the draining of the driver circuit current improves a bandwidth response function of the transmission system by increasing a half-power frequency limit.

12. The method of claim 8, wherein the steering of the driver circuit current improves a DC swing function of the transmission system by increasing a DC swing to above 99%.

13. A transmission system comprising:
a driver circuit, the driver circuit including a first multiplexer circuit and a second multiplexer circuit, the first multiplexer circuit and the second multiplexer circuit configured to operate as a differential pair, the first multiplexer circuit and second multiplexer circuit coupled to a first parallel data bus and a second parallel data bus and configured to receive parallel input data on the first parallel data bus and the second parallel data bus, the first multiplexer circuit and the second multiplexer circuit coupled to a first node and a second node of the driver circuit and configured to output serial data from the first multiplexer circuit and the second multiplexer circuit at the first node and the second node,
wherein the first node and the second node are coupled to an inductor circuit,
wherein the first node couples the first multiplexer circuit to a first cascode device and to a cross-coupled circuit,
wherein the second node couples the second multiplexer circuit to a second cascode device and to the cross-coupled circuit,
wherein the cross-coupled circuit is configured to drain driver circuit current from the inductor circuit, and
wherein the first cascode device is coupled to a first output node and is configured to output the serial data from the first node at the first output node, and the second cascode device is coupled to a second output node and is configured to output the serial data from the second node at the second output node.

14. The transmission system of claim 13, wherein the cross-coupled circuit incudes a pair of type transistors.

15. The transmission system of claim 13, wherein the first and second multiplexer circuits each comprises a group of switches.

16. The transmission system of claim 13, wherein the cross-couple circuit steers the driver circuit current to improve an operation of the first cascode device and the second cascode device.

17. The transmission system of claim 16, wherein the drain and steer of the driver circuit current operate to improve a bandwidth response function and a DC swing function of the transmission system.

18. The transmission system of claim 13, wherein the inductor circuit is an active inductor including a plurality of p-type and n-type transistors.

19. The transmission system of claim 13, wherein the driver circuit is implemented within a field-programmable gate array.

20. The transmission system of claim 13, wherein the driver circuit includes a differential output network coupled to the first and second nodes and the driver circuit is included on one slice of a driver array, the system further including a plurality of driver array slices, each of the slices configured to output the serial data on a common serial transmission line, the common serial transmission line coupled to the differential output network.

* * * * *